(12) United States Patent
Christoph

(10) Patent No.: US 9,118,290 B2
(45) Date of Patent: Aug. 25, 2015

(54) SPEED DEPENDENT EQUALIZING CONTROL SYSTEM

(75) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 510 days.

(21) Appl. No.: 13/483,039

(22) Filed: May 29, 2012

(65) Prior Publication Data

US 2012/0308036 A1    Dec. 6, 2012

(30) Foreign Application Priority Data

May 30, 2011   (EP) ..................................... 11168084

(51) Int. Cl.
 H04R 29/00    (2006.01)
 H03G 9/00     (2006.01)
 H03G 3/32     (2006.01)

(52) U.S. Cl.
 CPC ............... *H03G 9/005* (2013.01); *H03G 3/32* (2013.01); *H04R 29/00* (2013.01); *H04R 2499/13* (2013.01)

(58) Field of Classification Search
 CPC ........................... H04R 29/00; H04R 2499/13
 USPC ..................................................... 381/58, 68
 See application file for complete search history.

(56) References Cited

U.S. PATENT DOCUMENTS

| | | | | |
|---|---|---|---|---|
| 3,668,323 A | * | 6/1972 | Lee et al. ........................ | 381/86 |
| 3,784,748 A | * | 1/1974 | Brinkerhoff ..................... | 381/86 |
| 4,005,761 A | * | 2/1977 | Okamoto et al. ............... | 181/141 |
| 4,056,165 A | * | 11/1977 | Okamoto et al. ............... | 181/141 |
| 4,132,861 A | * | 1/1979 | Frieder et al. .................. | 381/335 |
| 4,329,544 A | * | 5/1982 | Yamada .......................... | 381/63 |
| 4,499,340 A | * | 2/1985 | Kasai et al. ..................... | 381/86 |

(Continued)

FOREIGN PATENT DOCUMENTS

| | | | | |
|---|---|---|---|---|
| EP | 1 575 163 A2 | 9/2005 | ............... | H03G 3/32 |
| EP | 1 876 706 A1 | 1/2008 | ............... | H03G 3/32 |
| WO | WO 2007/120453 A1 | 10/2007 | ............... | G10L 21/02 |

OTHER PUBLICATIONS

European Search Report, dated Dec. 6, 2011, pp. 1-7, European Patent Application No. 11168084.9, European Patent Office, The Netherlands.

(Continued)

*Primary Examiner* — Davetta W Goins
*Assistant Examiner* — Amir Etesam
(74) *Attorney, Agent, or Firm* — Brooks Kushman P.C.

(57) ABSTRACT

A speed dependent equalizing control system for automated design of gain and equalization filter parameters can be used for volume and velocity dependent equalization of audio signals reproduced in a vehicle. The system is configured to develop volume-dependent power spectral density estimations based on a test signal received at a number of different volume levels, and develop non-acoustical parameter-dependent power spectral density estimations based on received noise received at a number of different non-acoustical measurement values representing different states of the vehicle. In one example, the non-acoustical measurement values are different velocities, or speeds, of the vehicle. The system may generate filter parameters of a parameterized equalization filter based on a target equalization curve developed by summation of the volume-dependent power spectral density estimates and the non-acoustical measurement-dependent power spectral density estimates.

20 Claims, 4 Drawing Sheets

(56) References Cited

U.S. PATENT DOCUMENTS

| | | | |
|---|---|---|---|
| 4,501,013 A * | 2/1985 | Sato | 381/86 |
| 4,944,018 A * | 7/1990 | Bose et al. | 381/86 |
| 5,434,922 A * | 7/1995 | Miller et al. | 381/57 |
| 5,848,163 A * | 12/1998 | Gopalakrishnan et al. | 381/56 |
| 6,683,962 B1 * | 1/2004 | Griesinger | 381/97 |
| 7,333,618 B2 * | 2/2008 | Shuttleworth et al. | 381/57 |
| 7,853,026 B2 * | 12/2010 | DeLine et al. | 381/86 |
| 2004/0076302 A1 * | 4/2004 | Christoph | 381/57 |
| 2005/0265560 A1 * | 12/2005 | Haulick et al. | 381/58 |
| 2007/0253574 A1 * | 11/2007 | Soulodre | 381/94.2 |
| 2011/0255699 A1 * | 10/2011 | Osada et al. | 381/57 |
| 2014/0119565 A1 * | 5/2014 | Kim | 381/86 |
| 2014/0119566 A1 * | 5/2014 | Hiramoto et al. | 381/86 |

OTHER PUBLICATIONS

Johnston, J D, Transform Coding of Audio Signals Using Perceptual Noise Criteria, Feb. 1, 1988, pp. 314-323, vol. 6, No. 2, IEEE Journal on Selected Areas in Communications, IEEE Service Center, Piscataway, U.S.

* cited by examiner

FIG. 1 filter network for generating IEC268 noise standard values for IEC 268 noise (output impedance 100 kΩ)

SPEED DEPENDENT EQUALIZING CONTROL SYSTEM

TECHNICAL FIELD

The present invention relates to the field of audio signal processing, in particular to a speed dependent equalizing control system that provides automatic adjustment of volume and equalizer settings in response to changes of the speed of a vehicle in which the audio signal is presented to a listener.

BACKGROUND

It is common practice to adapt the volume of audio signals reproduced by an audio system in a vehicle dependent on the speed of the vehicle. In a simple application the volume control may directly depend on the tachometer signal. Accordingly, the volume is increased as the velocity of the vehicle (and thus the ambient noise) increases. Such an automatic velocity-dependent volume control is generally referred to as speed dependent volume control (SDVC). Generally, SDVC systems aim at maintaining the perceived volume (i.e. loudness) of a reproduced audio signal at a constant level in an environment with changing ambient noise due to changing velocity of the vehicle.

SUMMARY

A speed dependent equalizing control system provides automated determination of gain and equalization filter parameters. The filter parameters can be used for volume dependent equalization, and a non-acoustical value, such as velocity, dependent equalization of audio signals reproduced in a vehicle at a configurable volume setting. The system comprises: an audio amplifier configured to reproduce a test signal using at least one loudspeaker arranged in the passenger compartment of the vehicle so as to generate a corresponding acoustic test signal; at least one microphone arranged at a listening position and configured to sequentially pick up the acoustic test signal at different volume levels, as well as a noise signal at different non-acoustical values, such as velocity values associated with different speed values of the vehicle; and a signal acquisition and processing system for reception of the measured test and noise signals as well as the corresponding volume and non-acoustical values, such as corresponding velocity values of the vehicle. The signal acquisition processing system is configured to calculate volume-dependent and, respectively, non-acoustical value-dependent power spectral density estimations of the measured test and noise signals. The signal acquisition and processing system is further configured to calculate volume-dependent and, respectively, non-acoustical value-dependent, such as velocity-dependent, masking thresholds from the power spectral density estimations. Finally, the signal acquisition and processing system is configured to calculate, for each pair of volume and non-acoustical value, such as velocity, a target equalization curve being composed of the non-negative values of the difference between the volume dependent masking threshold calculated from the test signal power spectral density and the masking threshold calculated from the non-acoustical value dependent noise signal power spectral density. For each pair of volume and non-acoustical value, such as velocity, filter parameters of a parameterized filter prototype are calculated such that the filter magnitude response approximates the corresponding target equalization curve. Instead of the velocity, other non-acoustical values representing the state of the vehicle may be used.

BRIEF DESCRIPTION OF THE DRAWINGS

The invention can be better understood referring to the following drawings and descriptions. In the figures like reference numerals designate corresponding parts. In the drawings.

DETAILED DESCRIPTION

In a speed dependent volume control system (SDVC), the function yielding the desired volume (i.e. amplifier gain value) from an electric velocity signal (provided, for example, by the tachometer of the vehicle) is typically determined empirically by acoustical engineers during test drives. More detailed analysis shows that such an approach does not yield satisfying results as the determined velocity-dependent amplifier gain function (SDVC function) is not sufficient for maintaining the perceived volume at a constant level throughout the full velocity range (approximately 10 km/h to 200 km/h). Further, the "ideal" SDVC function is not the same at different volume settings, which can be manually pre-set using the volume knob of the amplifier. A more sophisticated approach can allow a listener to choose between different SDVC functions which represent different volume control characteristics. Thus, the listener may choose the volume control characteristics which fit best to his individual preferences and to the manually preset volume.

The spectral power density of the ambient noise is typically higher at lower frequencies (i.e. in a bass frequency range) than at higher frequencies. Control algorithms which take this fact into account can additionally include (besides SDVC) an adaptation of the equalizer settings. Such a frequency-dependent adaptation of gain values in different frequency ranges (typically within the bass frequency range) is generally referred to as "equalization control". Since it is also dependent on the speed of the car, it may also be referred to as "speed dependent equalization control" (SDEC).

In SDEC systems shelving filters can be used to manipulate the spectral characteristic of the audio signals, mainly in the bass frequency range. Such shelving filters may have fixed cut-off frequencies and different filter gain values in, for example, ten different volume ranges, in which each vector of (ten) volume dependent gain values also depends on the current velocity (discretized e.g. from 10 km/h to 200 km/h in steps of 10 km/h). Further, in some examples, the listener may select from among two or more different control characteristics (e.g. low, moderate, aggressive). Given all these unknown parameters, an acoustical engineer tuning an audio system may have to determine several hundred parameters by testing, which can be difficult to complete during one test drive and can typically be labor intensive and expensive. Further, it is questionable whether the performance of the overall audio system can actually be enhanced by using a higher number of parameters which also require "manual" adjustment.

When tuning the equalizer "manually", usually a known test signal (e.g. a music composition) is reproduced by a fully tuned (automotive) audio amplifier typically while an acoustical engineer sits on the front passenger seat subjectively assessing the sound impression based on his/her remembrance of the music (subjective psychoacoustic assessment of the audio reproduction). At the same time, the acoustical engineer can tune the parameters of the equalizing filter so as to optimize the (volume-dependent and velocity dependent) equalization filter characteristics. It should be noted that, instead of the velocity of the vehicle, any other non-acoustical measurement value may be considered. An appropriate additional non-acoustical value may be, for example, the rotational velocity of the vehicle's engine, the gear, window positions, position of the convertible top (in case of a convertible automobile), setting of the fan and/or defrost and so on.

In order to automate this tuning of the equalization filters, which are part of the SDEC system, a suitable test signal can be found. As the optimum parameters describing the equalization filter(s), known as SDEC parameters, are dependent on the test signal, the test signal cannot be chosen arbitrarily. If a female voice signal is used as a test signal, it might be sufficient to only increase the volume level in response to an increasing noise level in connection with an increasing velocity. As such, a test signal includes only a few spectral components in the bass frequency range, in which the masking effects due to the noise have the most significant impact on the perception of the test signal. However, if a rock song is used as a test signal the situation can be different. The strong spectral components in the bass frequency range could be increasingly masked by the noise signal at higher velocities, thus deteriorating the timbre of the perceived sound. This deterioration is intended to be compensated for by the SDEC system. As no "perfect" test signal exists, a test signal may be found which best matches the sound signals typically produced by an automotive audio system. Such matching may be assessed by comparing the power spectral density (PSD) of different test signal "candidates" as illustrated in FIG. 1.

Figure 1:
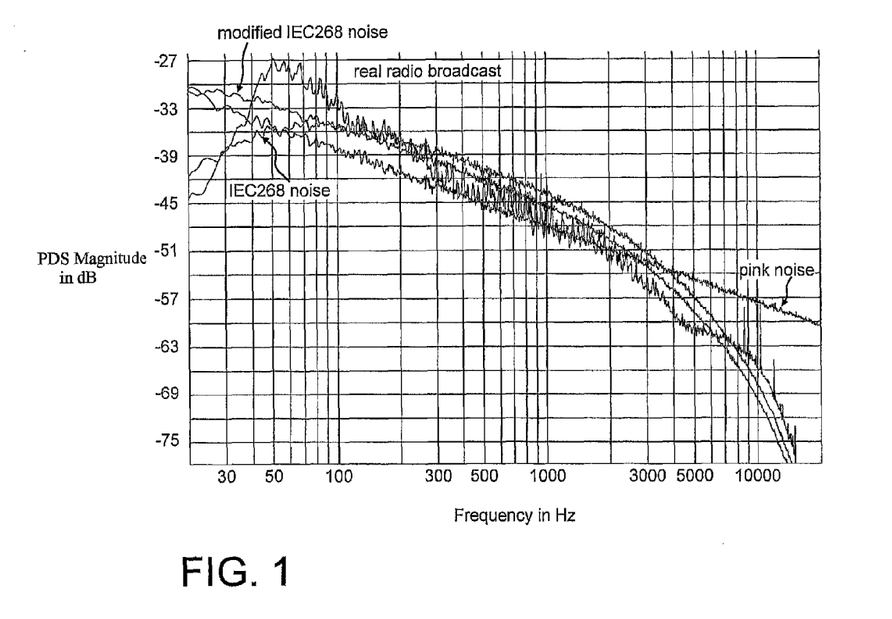
FIG. 1 illustrates an example of the power spectral density (PSD) of different test signals such as, for example, an audio signal received from a radio station or pink noise.

FIG. 1 is an example comparison of the PSDs of pink noise, IEC 268 standardized noise, a modified IEC 268 standardized noise, and an arbitrary audio signal of one hour length received from the radio broadcast station "Antenne Bayern". In FIG. 1, for frequencies above 100 Hz, the PSDs of the IEC268 standardized noise matches the PSD of the signal received from the radio broadcast station well. Assuming that a signal having the same spectral contents as a "real life" radio signal would be suitable for determining optimum SDEC parameters leads to the conclusion that the standardized IEC268 noise signal is a suitable candidate as a test signal. However, as illustrated in FIG. 1, the IEC 268 noise spectrum includes and provides relatively lower power in the bass frequency range as compared to the signal received from the broadcast station. Thus, a slightly modified IEC 268 noise was instead used during experiments, wherein this modified noise has a slightly higher energy level in the bass frequency range as compared to the standard IEC 268 noise. The generation of such a modified IEC 268 noise is explained below with respect to FIGS. 2 and 3.

Figure 2:
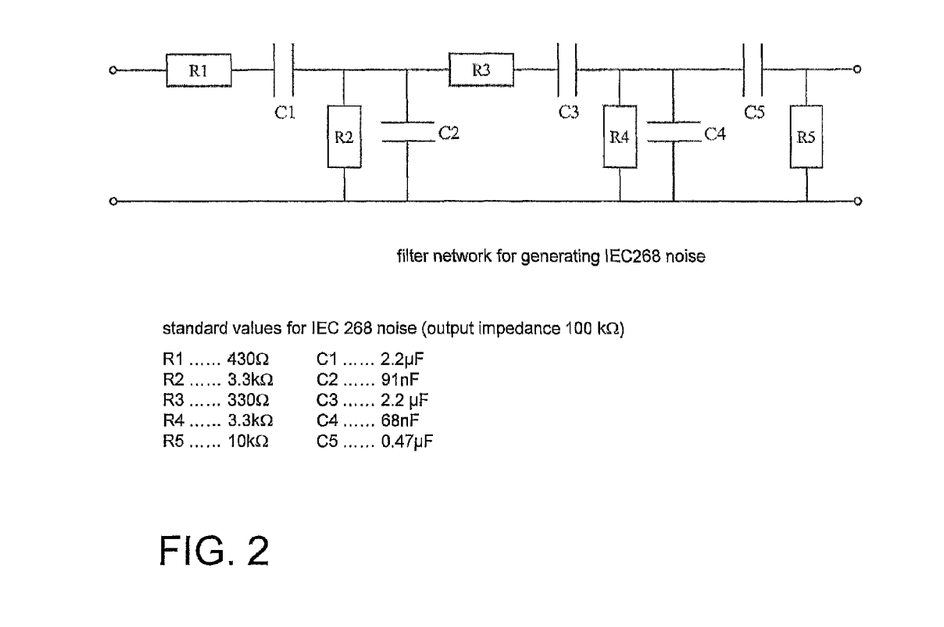
FIG. 2 illustrates an example of a filter network for transforming pink noise into IEC268 standardized noise.
Figure 3:
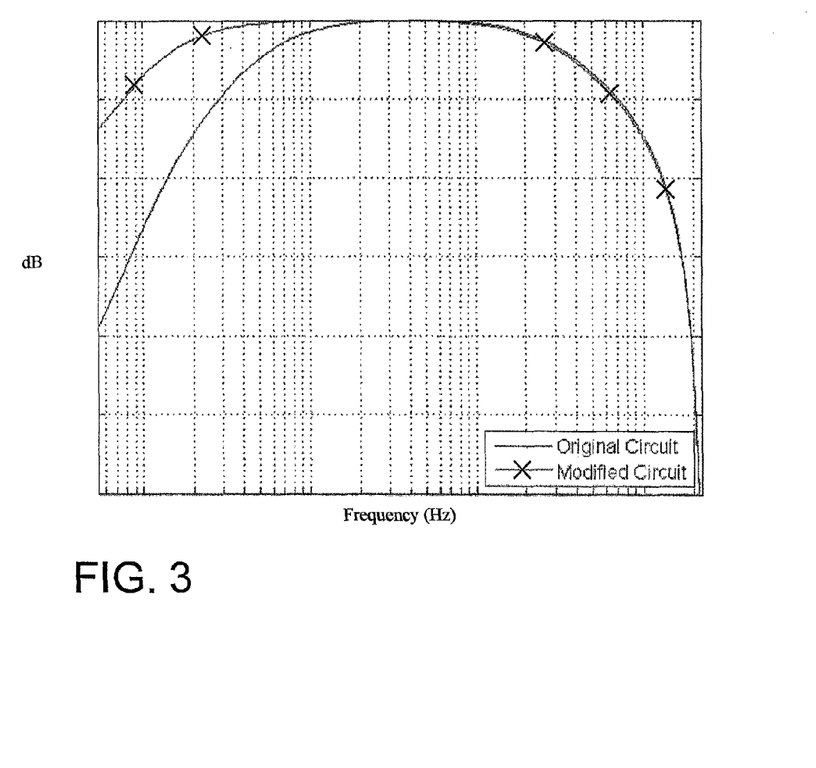
FIG. 3 illustrates an example of magnitude responses of the filter network of FIG. 2 for standard parameters and for modified parameters.

FIG. 2 illustrates an example filter network for the generation of IEC 268 noise using pink noise as an input audio signal. The corresponding example values for $R_1$ to $R_5$ and $C_1$ to $C_5$ are included in the table of FIG. 2. The "modified" IEC268 noise (see FIG. 1), which has a stronger bass content, can be generated by increasing the values of $C_3$ and $C_5$ by a factor of 4. The magnitude response of the filter network of FIG. 2, and the modified filter network is illustrated in FIG. 3. For the examples discussed herein a modified IEC 268 noise signal has been used as test signal. However, other (noise) signals may be used, provided their PSD approximately matches the PSD of a typical audio signal. Further, different SDEC parameters may be determined using different test signals representing different "genres" of audio signals (classic, jazz, pop, news, rock 'n' roll, etc.). The listener may then choose from among these different sets of SDEC parameters dependent on the audio signal he/she is currently listening to.

Figure 4A:
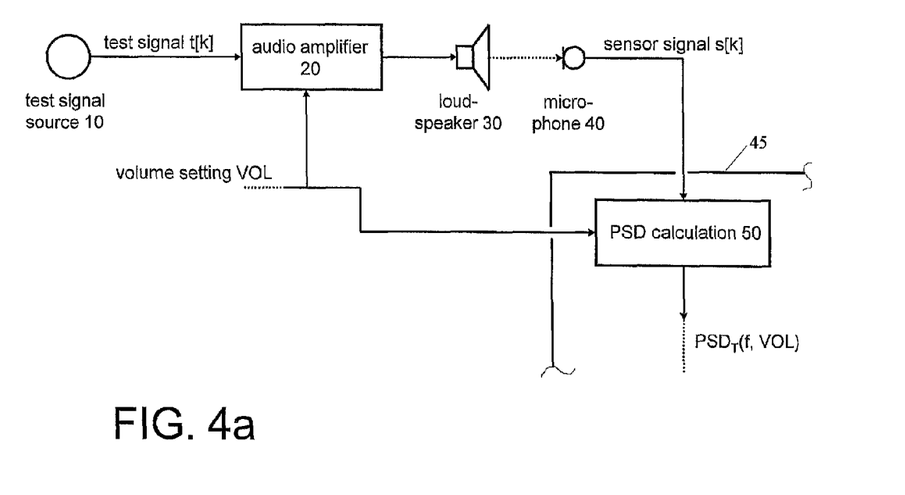
FIG. 4 is a block diagram schematically illustrating the measurement set-up of an example speed dependent equalizing control system for obtaining (a) the volume-dependent PSD of the test signal and (b) the velocity-dependent PSD of the ambient noise signal.
Figure 4B:
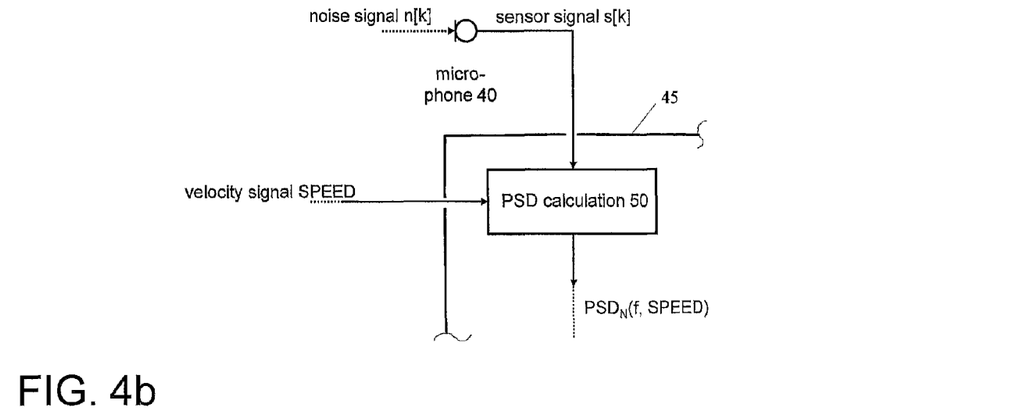

FIGS. 4a and 4b illustrate an exemplary measurement setup system which can be used to automatically determine an optimum set of SDEC parameters describing optimum equalization curves. Equalization may be performed dependent on the volume setting VOL of the amplifier (test signal source 10) producing the test signal t[k]. In other examples, the amplifier (test signal source 10) may be a fixed gain amplifier, and the volume level of the input signal to the amplifier may be varied. In these examples, the volume setting VOL may be provided by a volume level signal external to the amplifier, or sensed by the amplifier as changes in an energy level of the input signal to the amplifier, instead of being a volume level of the amplifier.

Equalization may also be performed based on a non-acoustical value (discretized), such as the velocity SPEED of the vehicle. Although many of the examples described refer to the velocity SPEED of the vehicle, these should be recognized as non-limiting examples since other non-acoustical measurement values may be used instead of the velocity SPEED of the vehicle. The non-acoustical measurement value may be represented by, for example, at least one of the rotational velocity of the vehicle's engine, the gear setting of the vehicle, one or more window positions of the vehicle, a position of the convertible top (in case of a convertible vehicle), a setting of a fan such as a heater fan and/or a defrost fan of the vehicle and/or any other non-acoustical measurements representative of acoustical properties in the vehicle. In other examples, the non-acoustical measurement value may be a weighted combination of two or more different signals, such as those previously discussed.

The velocity, however, is a parameter that can, in some examples, have the strongest impact on the ambient noise signal n[k]. The parameter k is a time index representing the sampling instant of the respective (digital) signal. In FIG. 4 components (digital-to-analog converters, microphone amplifiers, analog-to-digital-converters, input/output interfaces, and the like) have been omitted for ease of illustration.

FIG. 4a relates to the measurement of the volume-dependent PSD(f; VOL) of the test signal when reproduced by one or more loudspeakers 30 using a fully tuned hifi audio amplifier 20 which is set at a volume level VOL (usually measured in dB with 0 dB being the maximum volume). A microphone 40 picks up the resulting acoustic signal yielding a corresponding sensor signal s[k]. For this purpose the microphone 40 is placed in a position where a listener's ears are typically located, e.g. near the headrest of the front passenger seat. Alternatively, a binaural measurement may be performed. In the binaural measurement case, two microphones are placed in positions (e.g. near the headrest of the front passenger's seat) corresponding to the left and right ear of a passenger. For example, a dummy is positioned on the front passenger's seat and microphones are mounted at the positions of the dummy's ears. In order to simplify the set-up a headless dummy may be used.

FIG. 4 also includes a signal acquisition and processing system 45 as part of the measurement setup system. The signal acquisition and processing system 45 may be any form of signal processing system or device, such as, a data acquisition and signal processing system. The signal acquisition and processing system 45 may be configured as, or to include, a general processor, a digital signal processor, application specific integrated circuit, field programmable gate array, analog circuit, digital circuit, server processor, combinations thereof, or other now known or later developed processor. The signal acquisition and processing system 45 may be configured as a single device or combination of devices, such as associated with a network or distributed processing. Any of various processing strategies may be used, such as multi-processing, multi-tasking, parallel processing, remote processing, centralized processing or the like. The signal acquisition and processing system 45 may be responsive to or operable to execute instructions stored as part of software, hardware, integrated circuits, firmware, micro-code, or the like.

The signal acquisition and processing system 45 may include a memory formed to include any kind of storage device, such as RAM, ROM, a hard drive, a CD-R/W, a DVD, a flash memory, or any other one or more non-transitory data storage device or system capable of storing data and/or instructions executable by a processor. In addition to the operating system of the signal acquisition and processing system 45, the memory may also store data acquired by the data acquisition portion, and signal processing related data.

The signal acquisition and processing system 45 may also include number of modules that include a PSD calculation module 50 and a filter calculation module 60. The term "module" may be defined to include a plurality of executable modules. As described herein, the modules are defined to include software, hardware or some combination thereof executable by a processor. Software modules may include instructions stored in memory that are executable by the processor or other processor. Hardware modules may include various devices, components, circuits, gates, circuit boards, and the like that are executable, directed, and/or controlled for performance by the processor.

During operation, the signal acquisition and processing system 45 receives the sensor signal and the currently set volume level VOL and is configured to calculate a PSD of the test signal for various volume levels VOL using the PSD calculation module 50. The PSD calculated by the PSD calculation module 50 being denoted as $PSD_t(f; VOL)$. For the PSD calculation a short-term spectral analysis may be performed by the PSD calculation module 50. In accordance with one example the (digitized) sensor signal s[k] received by the PSD calculation module 50 is subjected to a series of subsequent windowed Fourier transform operations using a rectangular window function, wherein the window is time shifted by 50 percent of the window lengths between two subsequent Fourier transform operations. The Fourier transform may be implemented with the PSD calculation module 50 using a fast Fourier transform (FFT) algorithm processing input vectors of 1024 samples. That is, for each volume level VOL the following L calculations are performed (frequency index j):

$$PSD(j; VOL) = \frac{1}{L}\sum_{i=0}^{L} |FFT\{s[512 \cdot i : 512 \cdot i + 1023]\}|^2 \quad (1)$$

where the vector s[0:1023] includes the first 1024 samples of the sensor signal s[k], the vector s[512:1535] the samples 512 to 1535, the vector s[1024:2047] the subsequent 1024 samples, and so on. In other words, the volume-dependent power spectral density $PSD_t$ is estimated using the PSD calculation module 50 by averaging periodograms, e.g. IFFT{s[512·i:512·i+1023]}|², of the sensor signal s[k], also referred to as "Welch's method" for each volume value VOL. In other examples, other techniques for estimating the volume-dependent power spectral density $PSD_t$ may be performed by the PSD calculation module 50.

When using a binaural measurement, two sensor signals $s_1[k]$ and $s_2[k]$ are obtained. In this case a plurality of volume-dependent periodograms can be calculated by the PSD calculation module 50 for both sensor signals $s_1[k]$ and $s_2[k]$ in a similar way to that defined by equation (1) above. Finally, the averaged periodograms obtained from the left sensor signal $s_1[k]$ and those obtained from the right sensor signal $s_2[k]$ may, again, be averaged by the PSD calculation module 50 so as to calculate one volume-dependent power spectral density $PSD_t(j; VOL)$ of the test signal.

The velocity-dependent noise signal n[k] (non-acoustical measurement value-dependent noise signal n[k]) may be separately and independently processed in a substantially similar way as illustrated in the example of FIG. 4b. Therefore the velocity and the corresponding noise signal independently picked up by the microphone may be recorded during a test drive. The measurement set-up may be similar to the one used for recording the test signal. The sensor signal s[k] and the corresponding velocity signal SPEED may be received by the signal acquisition and processing system 45 and may be supplied to the PSD calculation module 50. The PSD calculation module 50 may be configured to calculate, for each velocity value SPEED or different velocity intervals, the PSD of the sensor signal in a substantially similar way as is done for the test signal, such as a short-term spectral analysis and a subsequent averaging may be performed. For example, the sensor signal s[k] may be split into segments associated with a defined velocity interval, such as [191, 200], [181, 190], [171, 180], . . . , [1, 10] by the PSD calculation module 50, each interval may be identified by a defined value SPEED. For each segment an averaged PSD may be calculated in substantially the same way as is done for the test signal (see FIG. 4a). In the example of FIG. 4b, however, SPEED is used as a parameter instead of VOL. As an intermediate result, a velocity dependent PSD function $PSD_n(f; SPEED)$ (non-acoustical measurement value-dependent PSD function) may be obtained. In other words, the velocity-dependent PSD is estimated by the PSD calculation module 50 by averaging periodograms (in accordance with Welch's method) of the sensor signal s[k] for each (e.g. discretized) velocity value SPEED.

Figure 5:
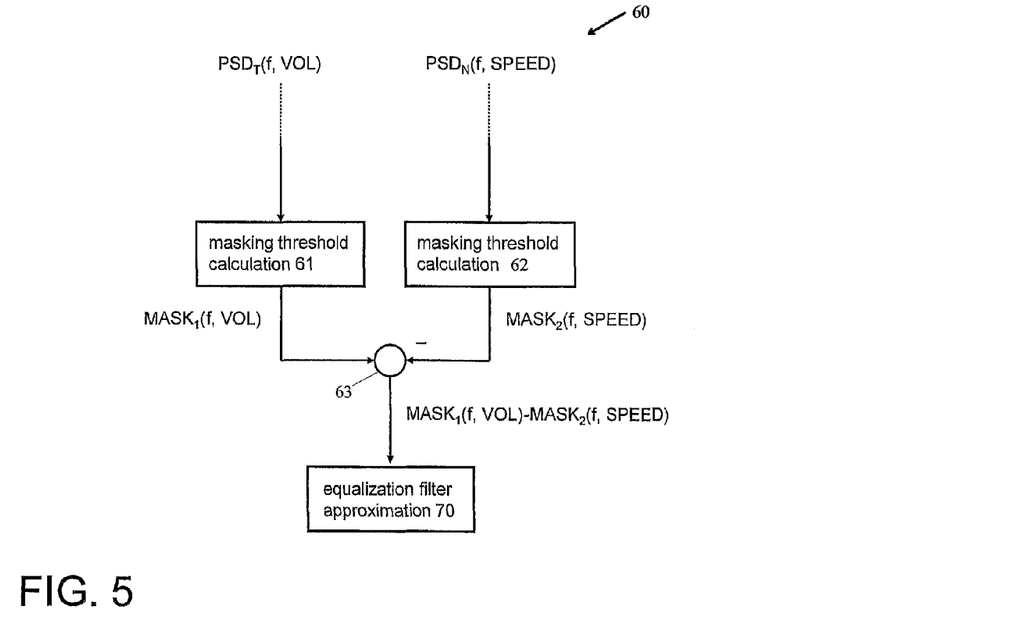
FIG. 5 is a block diagram schematically illustrating an example of the calculation of the "target" equalizing curve used in a subsequent equalization filter design.

FIG. 5 illustrates an example of further processing of the measured PSD functions $PSD_t(f; VOL)$ and $PSD_n(f; SPEED)$ using the filter generation module 60 included in the signal acquisition and processing system 45. The estimated PSD functions $PSD_t(f; VOL)$ and $PSD_n(f; SPEED)$ at a given frequency may be considered a pair. Operation of the filter generation module 60 is indicated in a respective flow chart that is depicted in FIG. 5. Accordingly, the masking thresholds $MASK_t(f; VOL)$ and $MASK_n(f; SPEED)$ are calculated (in decibel) by the filter generation module 60 from the previously determined PSD functions $PSD_t(f; VOL)$ and $PSD_n(f; SPEED)$, respectively using a masking threshold calculation module 61 and a masking threshold calculation module 62. Each of the masking threshold calculation module 61 and the masking threshold calculation module 62 perform the calculation using a mathematical model describing the psychoacoustic effect of spectral masking (masking model). For example, the "classic" Johnston model may be employed as described, for example, in *J. D. Johnston: Transform Coding of Audio Signals Using Perceptual Noise Criteria, in: IEEE J. on Selected Areas in Communications, vol. 6, no.* 2, February 1988. However, other masking models may also be applicable.

Figure 6:
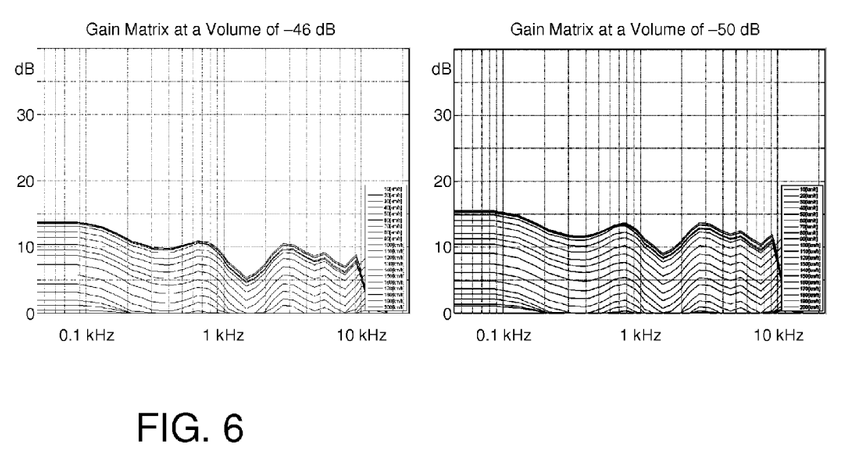
FIG. 6 illustrates an example of the masking threshold difference of the masking thresholds calculated from the measured PSDs at different volumes (−46 dB and −50 dB) and at different velocities (10 km/h to 200 km/h)

The positive values of a difference (in decibel) of the masking thresholds $MASK_t(f; VOL)$-$MASK_n$; SPEED) may be determined by a summation 63, which may subtract the $MASK_n$; SPEED) from the $MASK_t(f; VOL)$. The difference determined by the summation 63 may be used as a "target" equalization curve for a parameterized (parameters SPEED and VOL) equalization filter design. FIG. 6 shows, as an illustrative example, target equalization curves for different velocity values SPEED and for two different volume values VOL (−46 dB and −50 dB).

It has been found that equalization filters designed in accordance with the method described above may result in an audio reproduction with excessively strong spectral components in the bass frequency range. A typical audio signal received from a broadcast station is band limited to a lower cut-off frequency of about 50 Hz. The test signal (modified IEC 268 noise), however, is not band limited to frequencies above that cut-off frequency thus introducing a systematic error. However, this error depends on the actual band width of the audio system. To compensate for this error the sensor signal s[k] representing the noise signal n[k] picked up by the microphone may be high-pass filtered with a second order high-pass with a cut-off frequency of approximately 50 Hz.

Having calculated the target equalization curves as illustrated in FIG. 6, any filter design method may be used for approximating the target equalization curves using an appropriate parameterized digital prototypes filter. The approximation may be performed using any useful quality criterion. Usually the mean squared error between the actual digital filter and the target curve is minimized.

Figure 7:
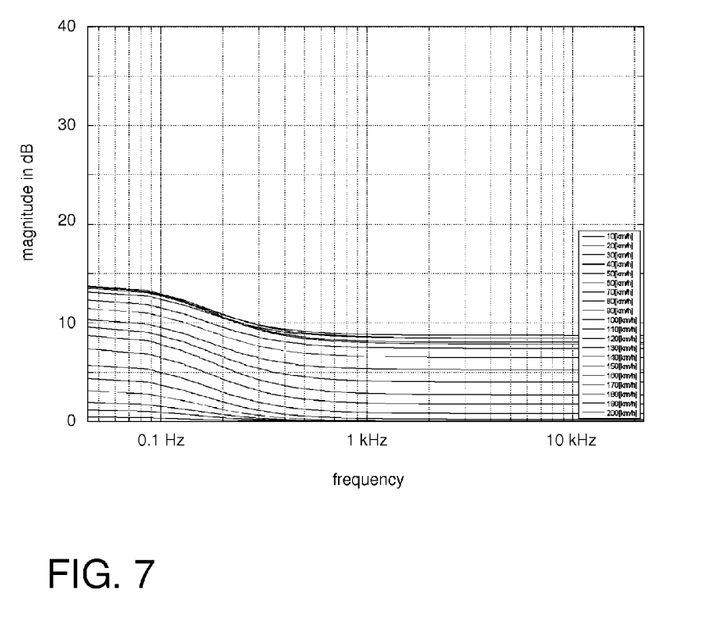
FIG. 7 illustrates an example of an equalization filter for a defined volume (−46 dB) whose filter characteristic approximates the corresponding masking threshold difference of FIG. 6.

Dependent on the prototype filter used, the number of the filter parameters (per velocity and volume value) to be determined may vary significantly. FIG. 7 illustrates an example of (for a volume value VOL of −46 dB) the resulting equalization filters when using, as a prototype filter, a simple second order shelving filter with a constant cut-off frequency. In essence, a good compromise between the number of parameters and the quality of approximation can be found.

Although the present invention and its advantages have been described in detail, it should be understood that various changes, substitutions, and alterations can be made herein without departing from the spirit and scope of the invention as defined by the appended claims.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A system for automatic determination of at least one of equalization filter parameters or gain parameters used for equalization of audio signals reproduced in a vehicle, the system comprising:

an audio amplifier configured to reproduce an audible test signal using at least one loudspeaker arranged in a passenger compartment of the vehicle so as to generate a corresponding acoustic test signal;

at least one microphone arranged at an at least one desired listening position and configured to sequentially pick up the audible test signal as a measured test signal at different volume levels, as well as a noise signal at different non-acoustical measurement values representing a current state of the vehicle;

a signal acquisition and processing system configured to receive the measured test signal and the noise signal, as well as the corresponding volume levels and non-acoustical measurement values, the signal acquisition and processing system being configured to:

calculate power spectral density estimations, which depend on the volume levels and respectively, on the non-acoustical measurement values, of the measured test signal and the noise signal, respectively, calculate corresponding masking thresholds, which depend on the volume levels and, respectively on the non-acoustical measurement values, from the power spectral density estimations;

calculate, for each pair of volume levels and non-acoustic measurement values, a target equalization curve, the target equalization curve being composed of non-negative values of a difference between a volume-dependent masking threshold calculated from a test signal power spectral density and a masking threshold calculated from a noise signal power spectral density, which depends on the non-acoustic measurement values; and calculate, for each pair of volume levels and non-acoustic measurement values, filter parameters of a parameterized filter prototype such that a filter magnitude response of the parameterized filter prototype approximates a corresponding target equalization curve.

2. The system of claim 1, where the audible test signal is a predetermined noise signal having a power spectral density that approximately matches a power spectral density of a real audio signal received from a radio broadcast station.

3. The system of claim 2, where the audible test signal is IEC 268 noise being selectively amplified for frequencies lower than approximately 100 Hz.

4. The system of claim 1, further comprising a high pass filter configured to filter the noise signal, which depends on the non-acoustic measurement value, picked up by the microphone.

5. The system of claim 1, where the masking thresholds are calculated using a Johnston model.

6. The system of claim 1, where the non-acoustic measurement values are representative of at least one of:

a velocity value representing a speed of the vehicle;

a rotational velocity value representing a rotational speed of an engine of the vehicle;

a gear setting of the vehicle;
a window positions;
a position of a convertible top; or
a state of a fan disposed in the vehicle.

7. The system of claim 1, where the non-acoustic measurement values are a weighted combination of at least two of:
a velocity value representing a speed of the vehicle;
a rotational velocity value representing a rotational speed of an engine of the vehicle;
a gear setting of the vehicle;
a window positions;
a position of a convertible top; or
a state of a fan disposed in the vehicle.

8. A method for an automatic design of equalization filter and/or gain parameters used for equalization of audio signals reproduced in a vehicle, the method comprising:
reproducing an acoustic test signal using an audio amplifier and at least one loudspeaker arranged in a passenger compartment of the vehicle, the acoustic test signal reproduced at a configurable volume setting;
sequentially picking up the acoustic test signal at different volume settings as a measured test signal with at least one microphone arranged at an at least one desired listening position within the vehicle;
sequentially picking up a noise signal as a measured noise signal with the at least one microphone at different non-acoustical measurement values representing a current state of the vehicle;
calculating power spectral density estimations, which depend on the volume settings and, respectively, on the non-acoustical measurement values, of the measured test signal and the measured noise signal, respectively,
calculating corresponding masking thresholds, which depend on the volume settings and, respectively, on the non-acoustical measurement values, from the power spectral density estimations;
calculating, for each pair of volume settings and non-acoustical measurement values, a target equalization curve, the target equalization curves being composed of non-negative values of the difference between a volume-dependent masking threshold, calculated from a test signal power spectral density, and the masking thresholds, calculated from a noise signal power spectral density, which depends on the non-acoustic measurement value; and
calculating, for each pair of volume levels and non-acoustic measurement values, filter parameters of a parameterized filter prototype such that a filter magnitude response of the parameterized filter prototype approximates a corresponding target equalization curve.

9. The method of claim 8, where the acoustic test signal is a predetermined noise signal having a power spectral density that approximately matches a power spectral density of a real audio signal received form a radio broadcast station.

10. The method of claim 9, where the test signal is IEC 268 noise selectively amplified for frequencies lower than approximately 100 Hz.

11. The method of claim 8, further comprising
high pass filtering the noise signal, which depends on the non-acoustic measurement value, picked up by the microphone.

12. The method of claim 8, where calculating corresponding masking thresholds comprises calculating the masking thresholds using a Johnston model.

13. The method of claim 8, where the non-acoustic measurement values are at least one of:
a velocity value representing a speed of the vehicle;
a rotational velocity value representing a rotational speed of an engine of the vehicle; and
a weighted superposition of a velocity value and a rotational velocity value.

14. The method of claim 8,
where calculating power spectral density estimation comprises:
calculating a plurality of periodograms from the at least one microphone signal; and
averaging the periodograms to obtain, as an estimate, the average of the periodograms.

15. The method of claim 8, where sequentially picking up the acoustic test signal and sequentially picking up the noise signal comprises:
performing a binaural measurement using a left microphone and a right microphone placed in the passengers compartment in positions corresponding to an ear position of a listening person when sitting in the vehicle, thus providing a left sensor signal and a right sensor signal;
and where calculating power spectral density estimations comprises:
calculating a plurality of periodograms from the left sensor signal and from the right sensor signal, respectively, and averaging the periodograms to obtain, as an estimate, the average of the periodograms.

16. A system for automated determination of filter parameters used for equalization of audio signals reproduced in a vehicle, the system comprising:
an audio amplifier configured to drive a loudspeaker to produce audible sound representative of a test signal, a volume level of the audible sound being adjustable;
a signal acquisition and processing system configured to receive first measured signals indicative of audible sound sensed by a sensor at each of a plurality of corresponding volume levels, and second measured signals indicative of noise sensed by a sensor for each of a plurality of corresponding non-acoustical measurement values representing a current state of the vehicle;
the signal acquisition and processing system further configured to generate volume-dependent power spectral density estimates based on the first measured signals at different volume levels, and non-acoustical measurement-dependent power spectral density estimates based on the second measured signals and the corresponding non-acoustical measurement values; and
the signal acquisition and processing system further configured to generate filter parameters of a parameterized equalization filter based on a target equalization curve developed by summation of the volume-dependent power spectral density estimates and the non-acoustical measurement-dependent power spectral density estimates.

17. The system of claim 16, further comprising a sensor configured to independently sense the audible sound and generate the first measured signal, and to independently sense noise and generate the second measured signal.

18. The system of claim 17, where the sensor comprises at least one microphone positioned in a listening position within a passenger cabin of the vehicle.

19. The system of claim 16, where the test signal is a predetermined noise signal representative of spectral content of audio signals in a passenger cabin of the vehicle.

20. The system of claim 16, where the plurality of corresponding non-acoustical measurement values are a plurality of different velocity values representative of different corresponding speeds of the vehicle.

\* \* \* \* \*